US008062909B2

(12) United States Patent
Wang et al.

(10) Patent No.: US 8,062,909 B2
(45) Date of Patent: Nov. 22, 2011

(54) MRAM WITH STORAGE LAYER AND SUPER-PARAMAGNETIC SENSING LAYER

(75) Inventors: Po-Kang Wang, San Jose, CA (US); Yimin Guo, San Jose, CA (US); Cheng Horng, San Jose, CA (US); Tai Min, San Jose, CA (US); Ru-Ying Tong, Los Gatos, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/661,365

(22) Filed: Mar. 16, 2010

(65) Prior Publication Data

US 2010/0178715 A1  Jul. 15, 2010

Related U.S. Application Data

(62) Division of application No. 11/200,380, filed on Aug. 9, 2005, now Pat. No. 7,696,548.

(51) Int. Cl.
*H01L 21/336* (2006.01)
*H01L 21/8246* (2006.01)

(52) U.S. Cl. ......................................................... 438/3

(58) Field of Classification Search .................. 257/295, 257/314, 390, 411, E43.001–E43.007, E27.005–E27.006, 257/E27.008, E29.164, E29.272, E29.323, 257/E21.208, E21.436, E21.663–E21.665; 365/158, 32, 33, 48, 50, 55, 66, 74, 80, 97, 365/130–131; 438/3, 785

See application file for complete search history.

(56) References Cited

U.S. PATENT DOCUMENTS

| 6,166,948 | A | 12/2000 | Parkin et al. |
| 6,396,735 | B2* | 5/2002 | Michijima et al. ............ 365/173 |
| 6,730,395 | B2 | 5/2004 | Covington |
| 6,844,202 | B2 | 1/2005 | Prinz et al. |
| 7,054,118 | B2 | 5/2006 | Daughton et al. |
| 7,238,979 | B2* | 7/2007 | Horng et al. .................. 257/295 |
| 7,250,662 | B2 | 7/2007 | Ingvarsson et al. |
| 2004/0023065 | A1* | 2/2004 | Daughton et al. ............ 428/693 |
| 2004/0075960 | A1* | 4/2004 | Li et al. ..................... 360/324.12 |
| 2004/0141367 | A1* | 7/2004 | Amano et al. ................. 365/158 |
| 2006/0039188 | A1* | 2/2006 | Ju .................................. 365/158 |

OTHER PUBLICATIONS

"Spin-Dependent Tunneling Junctions With Superparamagnetic Sensing Layers," by Dexin Wang et al., IEEE Transactions on Magnetics, vol. 39, No. 5, Sep. 2003, pp. 2812-2814.

* cited by examiner

*Primary Examiner* — Dao H Nguyen
*Assistant Examiner* — Tram H Nguyen
(74) *Attorney, Agent, or Firm* — Saile Ackerman LLC; Stephen B. Ackerman

(57) ABSTRACT

An MRAM is disclosed that has a MTJ comprised of a ferromagnetic layer with a magnetization direction along a first axis, a super-paramagnetic (SP) free layer, and an insulating layer formed therebetween. The SP free layer has a remnant magnetization that is substantially zero in the absence of an external field, and in which magnetization is roughly proportional to an external field until reaching a saturation value. In one embodiment, a separate storage layer is formed above, below, or adjacent to the MTJ and has uniaxial anisotropy with a magnetization direction along its easy axis which parallels the first axis. In a second embodiment, the storage layer is formed on a non-magnetic conducting spacer layer within the MTJ and is patterned simultaneously with the MTJ. The SP free layer may be multiple layers or laminated layers of CoFeB. The storage layer may have a SyAP configuration and a laminated structure.

8 Claims, 9 Drawing Sheets

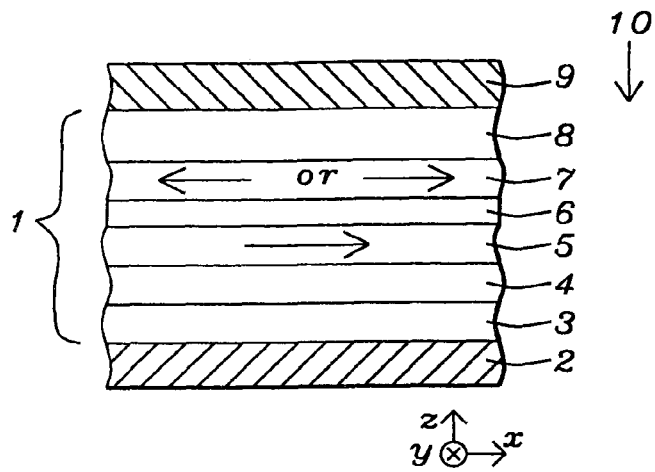
*FIG. 1 - Prior Art*
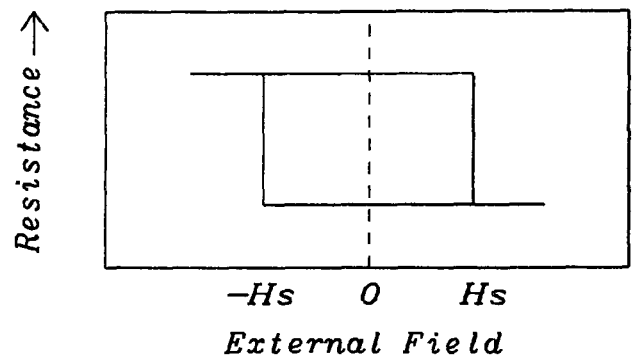
*FIG. 2 - Prior Art*
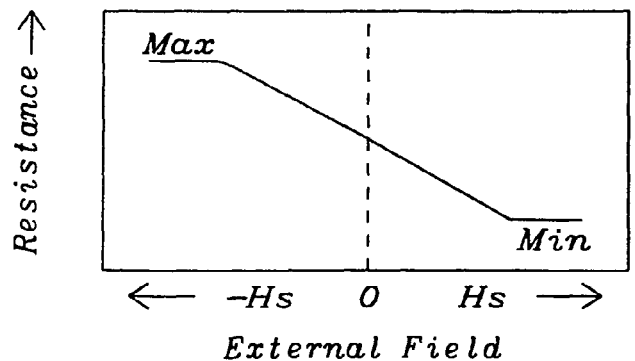
*FIG. 3*

MRAM WITH STORAGE LAYER AND
SUPER-PARAMAGNETIC SENSING LAYER

This is a Divisional application of U.S. patent application Ser. No. 11/200,380, filed on Aug. 9, 2005 now U.S. Pat No. 7,696,548, which is herein incorporated by reference in its entirety, and assigned to a common assignee.

FIELD OF THE INVENTION

The invention relates to a MRAM structure having a magnetic tunnel junction (MTJ) with one ferromagnetic layer and one super-paramagnetic free layer which are separated by a tunneling layer. Digital information is read out from a separate storage layer by the MTJ sensing element.

BACKGROUND OF THE INVENTION

Magnetic random access memory (MRAM) that incorporates a MTJ as a memory storage device is a strong candidate to provide a high density, fast (1-30 ns read/write speed), and non-volatile solution for future memory applications. An MRAM array is generally comprised of an array of parallel first conductive lines on a horizontal plane, an array of parallel second conductive lines on a second horizontal plane spaced above and formed in a direction perpendicular to the first conductive lines, and a MTJ interposed between a first conductive line and a second conductive line at each crossover point. A first conductive line may be a word line while a second conductive line is a bit line or vice versa. Alternatively, the first conductive line may be a sectioned line which is a bottom electrode. There are typically other devices including transistors and diodes below the array of first conductive lines.

The MTJ consists of a stack of layers with a configuration in which two ferromagnetic layers are separated by a thin insulating layer such as $Al_2O_3$, $AlN_xO_y$, or $NiO_x$ which is called a tunnel barrier layer. One of the ferromagnetic layers is a pinned layer in which the magnetization (magnetic moment) direction is more or less uniform along a preset direction and is fixed by exchange coupling with an adjacent anti-ferromagnetic (AFM) pinning layer. The second ferromagnetic layer is a free layer in which the magnetization direction can be changed by external magnetic fields. The magnetization direction of the free layer may change in response to external magnetic fields which can be generated by passing currents through the conductive lines as in a write operation. When the magnetization direction of the free layer is parallel to that of the pinned layer, there is a lower resistance for tunneling current across the insulating layer (tunnel barrier) than when the magnetization directions of the free and pinned layers are anti-parallel. The MTJ stores digital information ("0" and "1") as a result of having one of two different magnetic states.

In a read operation, the information is read by sensing the magnetic state (resistance level) of the MTJ through a sensing current flowing through the MTJ, typically in a current perpendicular to plane (CPP) configuration. During a write operation, the information is written to the MTJ by changing the magnetic state to an appropriate one by generating external magnetic fields as a result of applying bit line and word line currents. Cells which are selectively written to are subject to magnetic fields from both a bit line and word line while adjacent cells (half-selected cells) are only exposed to a bit line or a word line field. Due to variations in MTJ size and shape that affect the switching field of a free layer, a magnetic state in a half-selected cell may be undesirably altered when writing to a selected cell.

To preserve data (magnetic state) against erasure, an in-plane magnetic anisotropy has to be strong enough in the storing magnetic layer. Current designs are based on shape anisotropy involving rectangular, ellipse, eye, and diamond-like patterns. Coercivity in these designs is highly dependent on shape, aspect ratio, and MTJ cell size and is therefore very sensitive to cell shape and edge shape which are subject to variations because of cell patterning processes. As a result, MTJ cell differences can make the switching field highly variable and difficult to control.

Referring to FIG. 1, a conventional MTJ 1 is shown between a first conductive layer 2 and a second conductive layer 9. The MTJ 1 is comprised of a seed layer 3, an anti-ferromagnetic (AFM) layer 4, a ferromagnetic (pinned) layer 5, a tunnel barrier layer 6, a ferromagnetic (free) layer 7, and a capping layer 8. A sensing current 10 is shown in a CPP configuration along the z-axis. In the quiescent state, the free layer magnetization lies along the orientation of the pinned layer, either parallel or anti-parallel to the pinned layer magnetization. In other words, in an example where the magnetic direction of the pinned layer 5 is aligned along the +x direction, the magnetic direction of the free layer 7 may be oriented along either the +x or −x direction. Storage of the digital information is thus provided by the direction of the free layer magnetization.

Referring to FIG. 2, the resistance of a MTJ element is shown as a function of the external field along the orientation of the pinned layer magnetization. When the field is off, the two states with minimum and maximum resistance correspond to the free layer magnetization being parallel and anti-parallel, respectively, to the pinned layer magnetization. The field (Hs) required to switch between the two states is determined by the anisotropy energy which is related to shape anisotropy, for example, of the element.

The MTJ configuration depicted in FIG. 1 has several shortcomings with regard to MRAM applications. The coupling between the free layer and the pinned layer due to roughness of the tunnel barrier (oxide) layer is often called the orange peel effect. This coupling induces a bias in the switching threshold of free layer magnetization. Variations in this coupling cause undesirable variations in the switching threshold. A second problem with conventional MTJs is that magnetic charges at the edges of the pinned layer produce a bias and variations in this bias also lead to variations in the switching threshold. Another issue is that in order to achieve reliable switching behavior, the free layer is generally limited to materials with small coercivity (Hc). However, materials with small Hc typically do not produce a sufficiently high magnetoresistive (MR) ratio to meet high performance requirements. On the other hand, materials such as CoFeB and CoFe with high Fe content that are desirable for high MR ratios do not have the necessary magnetic softness for low coercivity. Therefore, a novel MTJ configuration is needed to overcome these shortcomings in state of the art MRAM devices.

U.S. Pat. No. 6,844,202 discloses a sensor to detect the presence of magnetic particles that are essentially paramagnetic such that their magnetization is a function of the external magnetic field. The sensor element is a planar layer with a circular magnetic moment that changes to a radial direction due to a radial fringing field of the magnetic particles.

A MTJ is disclosed in U.S. Pat. No. 6,730,395 and in related U.S. Patent Application 2002/0074541 wherein a hard layer of a magnetic device is made of nanoparticles that are separated by an insulating barrier comprised of a carbonbased coating. The free layer is formed on the insulating barrier. In this case, the nanoparticles are required to remain ferromagnetic to maintain a magnetic moment.

In U.S. Patent Application 2005/0026308, a magnetic liner is formed with super para-magnetic properties to eliminate fringing fields and hysteresis effects. Ferromagnetic films are made from ferromagnetic particles about 10 nm in size and are separated from one another by a polymer, non-magnetic metal, or an oxide.

U.S. Patent Application 2004/0023065 and a related publication "Spin-Dependent Tunneling Junctions with Superparamagnetic Sensing Layers" by D. Wang et. al, IEEE Transactions on Magnetics, Vol. 19, No. 5, p. 2812-2814 (2003) describe a super-paramagnetic (SP) free layer made of NiFeCo that is formed on a Ru bottom electrode. The Ru bottom electrode functions as a buffer layer to enable formation of uniform platelets in the overlying NiFeCo layer. However, as the device has no hysteresis, information cannot be stored therein. Thus, the scope is limited to a magnetic field sensor and does not encompass memory applications.

SUMMARY OF THE INVENTION

One objective of the present invention is to provide a MTJ based on a super-paramagnetic (SP) free layer in a pinned/tunnel/SP free configuration that eliminates the problem of free layer/pinned layer coupling and the incompatibility issue for free layer materials to have a low Hc and yet produce a high MR ratio for the MTJ.

A second objective of the present invention is to provide a MRAM structure having a storage element for digital information that is separate from a MTJ element comprised of a super-paramagnetic free layer.

In accordance with the present invention, there is a MTJ element (sensor) comprised of a stack with a ferromagnetic (pinned) layer, a middle tunneling layer, and a SP free layer wherein the pinned layer is the bottom layer in the stack. The SP free layer has no (or very little) residual magnetization in the absence of an external field and has a magnetization substantially proportional to an external field in any orientation. The MTJ may be further comprised of a seed layer formed on a substrate and an anti-ferromagnetic (AFM) layer between the seed layer and pinned layer that pins the magnetic orientation of the pinned layer along a first axis. In this configuration, the MTJ may serve as a linear sensing element that has no shape requirement. The seed layer is disposed on a substrate such as a first conductive line which is also known as a bottom electrode or bottom conductor. The bottom conductor may serve only as a connection to an underlying selection transistor.

In the exemplary embodiment that applies to a MRAM structure, a key element is a storage layer for storing digital information that can be read out by the MTJ sensing element. In one aspect, the storage layer is a separate ferromagnetic or ferrimagnetic layer which is formed above, below, or adjacent to the MTJ sensor. The storage layer may be laminated and may be pinned by an AFM layer. The storage layer has anisotropy such as shape anisotropy to produce at least two stable states for storing digital information. Preferably, the easy axis of storage layer anisotropy is aligned so that the stray field from storage layer magnetization is in the same orientation as the pinned layer magnetization along a first axis. In one aspect in which the MTJ has a pinned/tunnel/SP free configuration, the storage layer can be positioned above the free layer or below the pinned layer. When the MTJ has a SP free/tunnel/pinned configuration, the storage layer may be located above the pinned layer or below the free layer. The MTJ may also include an uppermost capping layer wherein the capping layer contacts the bottom of a top conductor. The lengthwise directions of the top and bottom conductors are not necessarily orthogonal to each other.

In a second embodiment, the storage layer and MTJ layers are deposited during the same deposition sequence, and patterned simultaneously to provide a self-aligned configuration. The storage layer is formed on a non-magnetic conducting spacer layer within the MTJ and has a magnetization that can be aligned parallel (representing the digital state "0") or anti-parallel (representing the digital state "1") to the pinned layer magnetization direction. This embodiment encompasses at least four configurations in which the first stack comprised of the storage layer on the spacer can be placed either above or below a second stack that includes the pinned layer, AFM layer, tunneling (insulating layer) and S-P free layer. Moreover, the second stack may have the pinned layer either above or below the tunneling layer. In all configurations, there is a seed layer below the second stack and a capping layer as the uppermost layer in the MTJ.

In either embodiment, the storage layer may be comprised of laminated layers as in a synthetic structure. Furthermore, the pinned layer may have a synthetic anti-parallel (SyAP) configuration to minimize the stray field from pinned layer magnetization.

BRIEF DESCRIPTION OF THE DRAWINGS

FIG. 1 is a cross-sectional view showing that free layer magnetization is aligned either parallel or anti-parallel to pinned layer magnetization in a conventional MTJ.

FIG. 2 is a plot that shows the resistance of the MTJ element in FIG. 1 as a function of the external field along the orientation of the pinned layer magnetization.

FIG. 3 is a plot that shows MTJ resistance vs. external field in any direction (other than being exactly orthogonal to the pinned layer magnetization) according to an embodiment of the present invention.

DETAILED DESCRIPTION OF THE INVENTION

Figure 4:
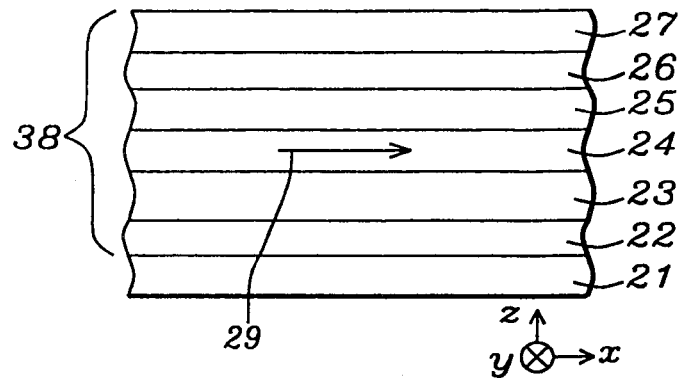
FIG. 4 is a cross-section of a MTJ having an insulating (tunneling) layer between a pinned layer and S-P free layer according to one embodiment of the present invention

The present invention is a MRAM structure comprised of a MTJ having a ferromagnetic layer and a super-paramagnetic (SP) free layer that are separated by a tunneling layer in a pinned/tunnel/SP free configuration. The MRAM also includes a storage layer (for storing digital information) that is separated from the MTJ, disposed on the top surface of the MTJ, or formed at the bottom surface of the MTJ. The drawings are provided by way of example and are not intended to limit the scope of the invention. Note that only one MTJ is depicted in the drawings but it should be understood that there are a plurality of MTJs in an array that has multiple rows and columns in a memory device such as an MRAM chip. Furthermore, the MTJ may have a pinned/tunnel/SP free configuration or an SP free/tunnel/pinned configuration. The super-paramagnetic free layer has no (or very little) residual magnetization in the absence of an external field and has a magnetization substantially proportional to an external field in any orientation until reaching a saturation value.

The exemplary embodiments depict a 1T1MTJ MRAM architecture wherein a bit line is the top conductor line and the bottom electrodes are patterned conductor pads connected to an underlying selection transistor (not shown). Word lines are separated by an insulator layer from other conductive elements and are positioned above the bit lines or beneath the bottom electrode. However, the present invention may also apply to a "cross point array" architecture in which MTJs are connected directly to bit lines and word lines as appreciated by those skilled in the art.

According to the present invention, a plot (FIG. 3) is shown of MTJ resistance vs. external field in any direction (other than being exactly orthogonal to the pinned layer magnetization). The plot in FIG. 3 is used to introduce the basic concept of a MTJ configuration having a tunneling layer between a ferromagnetic (pinned) layer and a super-paramagnetic free layer. Without an external field (Hs=0), there is no remnant magnetization in the SP free layer and the MTJ resistance is midway between maximum and minimum values. With a small external field, the remnant magnetization is roughly proportional to the external field and so is the MTJ resistance. Note that the indicated linear behavior is only approximate and only exists for a small field. The total resistance change depends on the orientation of the applied field. The maximum resistance change is achieved when the applied field is in the same orientation as the pinned layer. As the applied field orientation deviates from the pinned layer magnetization direction, the total resistance change becomes smaller and equals zero when the applied field is orthogonal to the pinned layer magnetization direction.

Referring to FIG. 4, a MTJ 38 formed according to the present invention is illustrated. The MTJ 38 is formed on a substrate 21 which may be a bottom conductor in a MRAM structure. Typically, the bottom conductor is coplanar with a first insulation layer (not shown) and is formed in an array of bottom conductors by a conventional method. The MTJ 38 is formed on the substrate 21 by a method known to those skilled in the art. Generally, a MTJ stack of layers is sputter deposited on the array of bottom conductors and the adjoining first insulation layer and then a patterning and etching sequence is followed to generate a plurality of MTJs on the bottom conductors wherein each MTJ has a top, bottom, and sidewalls, and there is one bottom conductor below each MTJ element.

The bottom layer in the MTJ 38 is typically a seed layer 22 such as NiFeCr, NiCr, Ta, Ru, or laminated films thereof that promote uniform and densely packed growth in subsequently formed layers. Above the seed layer 22 is an anti-ferromagnetic (AFM) layer 23 which in one embodiment is PtMn although NiMn, OsMn, IrMn, RuMn, RhMn, PdMn, RuRhMn, or PtPdMn may also be employed as the AFM layer which is used to pin the magnetization direction in an overlying ferromagnetic (pinned) layer 24. The pinned layer 24 is preferably comprised of one or more of Ni, Co, and Fe or an alloy thereof and has a thickness between about 10 and 200 Angstroms. The magnetization direction of the pinned layer 24 is set along the x-axis in this example. Optionally, the pinned layer 24 may be a synthetic anti-parallel pinned (SyAP) layer in which two ferromagnetic layers (not shown) such as CoFe of slightly different thicknesses are separated by a thin Ru, Rh, or Ir coupling layer that maintains strong anti-parallel magnetic coupling between the two ferromagnetic layers as appreciated by those skilled in the art. In other words, the SyAP pinned layer has a sandwich configuration in which the magnetization direction of a lower ferromagnetic (AP2) layer may be fixed along the x-axis by the AFM layer 23. An upper ferromagnetic (AP1) layer has a magnetization direction anti-parallel to that of the AP2 layer that results in a small net magnetic moment for the pinned layer along the same axis as the AP2 magnetic moment. The SyAP configuration minimizes the stray field from the pinned layer magnetization.

In one aspect, the AFM layer 23 may be omitted. In this case, the pinned layer 24 may have a magnetization direction set along the x-axis by an external magnetic field that was applied during deposition or during an annealing step.

A tunnel barrier layer also known as an insulating layer and hereafter referred to as tunneling layer 25 is disposed on the ferromagnetic (pinned) layer 24. In one embodiment, an Al layer is sputter deposited on the pinned layer and is subsequently oxidized to form a tunneling layer 25 comprised of $AlO_x$ with a thickness of about 5 to 15 Angstroms before the remaining MTJ layers are sputter deposited. Alternatively, the tunneling layer 25 may be made of TiOx, HfOx, MgO, or a lamination of one or more of the aforementioned oxides. In another embodiment, the tunneling layer 25 is comprised a nitride such as AlNx, TiNx, HfNx, MgNx, or a lamination of one or more of the aforementioned nitrides.

There is an SP free layer 26 having a thickness of from 5 to 20 Angstroms formed on the tunneling layer 25. In one aspect, the SP free layer 26 is comprised of nano-magnetic particles isolated from each other without exchange coupling among particles. For example, the same ferromagnetic materials employed in a conventional MTJ such as Co, Fe, Ni, and alloys thereof, including CoFe, NiFe, CoFeNi and CoFeB may be used as the SP free layer 26 but at a thickness below a certain critical thickness. Preferably, the SP free layer 26 has a composition represented by $Co_xFe_yB_z$ wherein x, y, and z are the atomic % of Co, Fe, and B, respectively, x+y+z=100, x is between about 40 and 60, y is from about 15 to 30, and z is from about 12.5 to 25. Below the certain critical thickness, the SP free layer may become discontinuous and resemble a nano-magnetic layer with isolated magnetic particles. The present invention also encompasses multiple layers of the so-called nano-magnetic layers arranged in a laminated structure in order to advantageously provide a high MR ratio. Furthermore, materials such as Cr, Ta, Ag, Cu, and Zr that promote grain separation may be added as thin layers about 2 to 30 Angstroms thick between laminated magnetic layers in the SP free layer 26 to further isolate magnetic particles. The SP free layer 26 described herein has no (or very little) residual magnetization in the absence of an external field and has a magnetization substantially proportional to an external field (in any orientation) with small field values.

In the exemplary embodiment, the top layer of the MTJ 38 is a capping layer 27 with a thickness of about 50 to a few hundred Angstroms and is typically a conductive material such as Cu, Ru, Ta, TaN, W or a composite layer. Alternatively, the capping layer 27 is omitted and is replaced by a non-magnetic spacer layer that serves as a seed layer for a storage layer to be explained in a later section.

Figure 5:
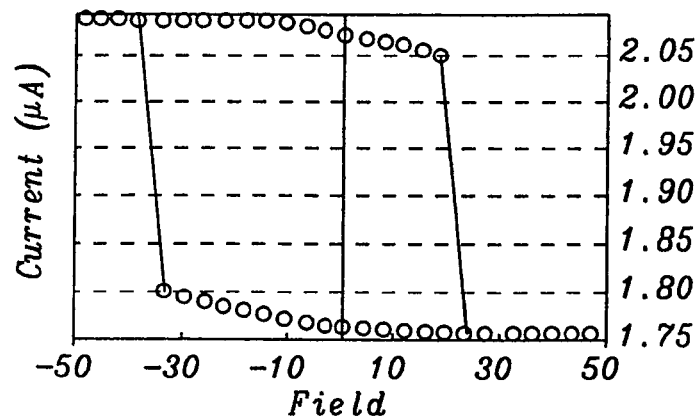
FIG. 5 is a plot of field vs. current that depicts the characteristics of a conventional MTJ element having a tunneling layer between a free layer and a pinned layer.
Figure 6:
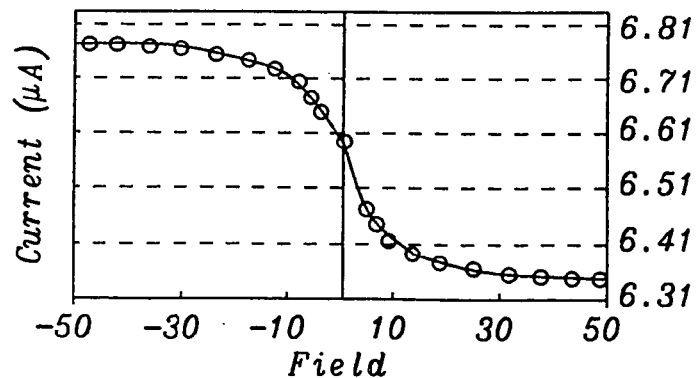
FIG. 6 is a plot of field vs. μA for a MTJ according to one embodiment of the present invention wherein a tunneling layer is between a pinned layer and an S-P free layer.

Referring to FIG. 5, the characteristics of a conventional MTJ are illustrated. The data in this plot was generated from an MTJ stack that was fabricated by successively forming the following layers on a substrate: a 40 Angstrom thick seed layer made of NiCr; a 150 Angstrom thick AFM layer made of PtMn; a SyAP pinned layer comprised of a lower 18 Angstrom thick CoFe layer and an upper 15 Angstrom thick CoFe layer separated by an 8 Angstrom thick Ru layer; an AlOx tunneling layer made by oxidizing a 10 Angstrom thick Al film; a laminated ferromagnetic free layer comprised of a 30 Angstrom thick NiFe layer on a 5 Angstrom thick CoFe layer; and a 250 Angstrom thick Ru capping layer. FIG. 6 shows the results of the same MTJ stack except the free layer is an S-P free layer comprised of a laminated film with a 15 Angstrom thick NiFe layer on a 5 Angstrom thick CoFe layer according to an embodiment of the present invention. The two MTJ elements were patterned by the same process sequence and have an elliptical shape from a top-down perspective with a long axis of 1 micron in length and a short axis of 0.5 microns in length. As mentioned previously with respect to FIG. 3, there is no remnant magnetization in an SP free layer in the absence of an external field and the MTJ resistance as measured by a current (in μA) is midway between maximum and minimum values at the point where the external field is zero.

Without remnant magnetization, the MTJ element functions as a field sensor. In MRAM applications, a separate storage layer is required to store information. As a consequence, an advantage of the present invention is that the storage layer and MTJ can be improved independently. Specifically, the SP free layer is optimized for high dR/R while the storage layer is optimized for magnetic softness and thermal stability. It should be noted that a seed layer may be employed to optimize the magnetic properties of a seed layer deposited thereon. Accordingly, a seed layer comprised of Ta, Ru, Cu, NiCr, NiFeCr, or laminations thereof, or alloys thereof may be used advantageously to promote the deposition of an overlying storage layer.

A key feature of the present invention is a storage layer that is preferably a ferromagnetic layer such as NiFe, CoFe, or alloys thereof or a ferrimagnetic layer as understood by those skilled in the art. Optionally, the storage layer may be pinned by an AFM layer (not shown) formed on at least one side of the storage layer. Furthermore, the storage layer may have a SyAP configuration as understood by those skilled in the art. In an alternative embodiment, the storage layer is a lamination of one or more ferromagnetic layers and/or one or more ferrimagnetic layers. The storage layer needs anisotropy such as shape anisotropy to produce at least two stable states for storing digital information. The digital values "0" and "1" are represented by a storage layer magnetization aligned parallel or anti-parallel, respectively, to the pinned layer magnetization direction. The storage layer has a certain thickness, a lengthwise dimension that is preferably unequal to a widthwise dimension, and a shape in the form of a rectangle, ellipse, eye, or diamond from a top-down view. To maximize the signal output, the easy axis of storage layer anisotropy is preferably oriented such that the stray field from the storage layer magnetization is in the same orientation as the ferromagnetic (pinned) layer magnetization. In other words, the storage layer preferably has a uniaxial anisotropy. The easy axis is defined as the preferred axis for the magnetization direction. There are several embodiments for configuring the storage layer in relation to an SP free layer and a pinned layer in an adjacent MTJ.

Figure 7:
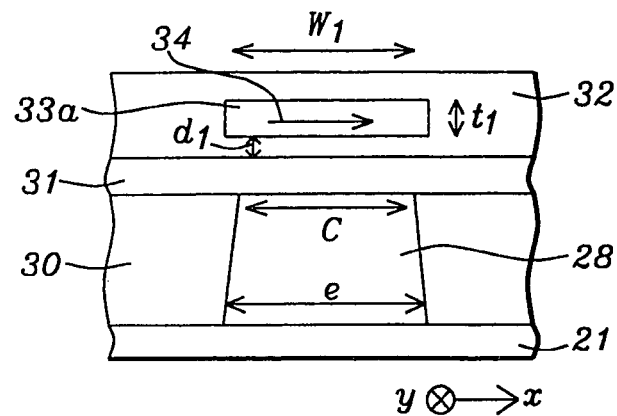
FIG. 7 is a cross-section of a MRAM according to one embodiment of the present invention in which a storage layer is separated from and positioned above a top conductor and a MTJ having a super-paramagnetic free layer.

Referring to FIG. 7, an embodiment is depicted in which a MTJ 28 having an SP free layer (not shown) is formed between a bottom conductor 21 and a top conductor 31, and an insulating layer 30 is disposed along both sidewalls of the MTJ. In one aspect, the MTJ 28 is equivalent to the MTJ 38 described previously. Optionally, the MTJ 28 may have a SP free/tunnel/pinned configuration involving tunneling layer 25 (not shown), a pinned layer with a composition and thickness similar to that of pinned layer 24, and an SP free layer with a thickness and composition similar to that of SP free layer 26. The width c of the top portion of the MTJ may be less than or about equal to the width e of the bottom portion of the MTJ. There is a storage layer 33a having a thickness $t_1$ of about 20 to 50 Angstroms and a lengthwise dimension $w_1$, preferably greater than c, which is located above and separated from the top conductor 31 by a distance $d_1$. The storage layer 33a is formed in a second insulating layer 32 made of silicon oxide or another dielectric material that may be comprised of a stack of dielectric layers. The insulating layer 32 extends a certain distance above the storage layer 33a. The stray field 34 from the storage layer 33a is oriented along the x-axis similar to the magnetization direction of the pinned layer 24 (not shown). In other words, the long axis of storage layer 33a is preferably in the same direction as the magnetization direction of the pinned layer 24.

Figure 8:
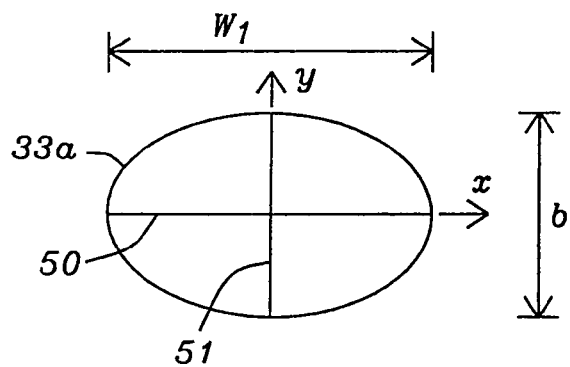
FIG. 8 is a top-down view of the storage layer in FIG. 7 showing one embodiment where an elliptical shape is used to provide shape anisotropy.

Referring to FIG. 8, a top-down view of the storage layer 33a is shown. In the exemplary embodiment, the shape anisotropy is produced by an elliptical shape having a long axis 50 with the lengthwise dimension $w_1$ along the x-axis and a short axis 51 oriented along the y-axis and having a width b wherein $w_1 > b$. From a top-down perspective, the shape of the storage layer 33a may be different than the shape of the MTJ 28. In other words, the storage layer 33a may have an elliptical shape while the MTJ 28 has a rectangular, eye, or diamond like shape.

Figure 9:
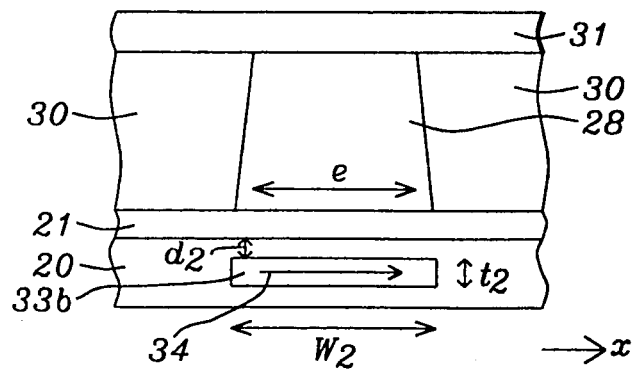
FIG. 9 is a cross-section of a MRAM according to one embodiment of the present invention in which a storage layer is separated from and positioned below a bottom conductor and a MTJ having a super-paramagnetic free layer.

Referring to FIG. 9, a second embodiment is shown in which a storage layer 33b having a length $w_2$ along the x-axis and a thickness $t_2$ of from 20 to 50 Angstroms is formed within an insulating layer 20 at a distance $d_2$ beneath the bottom conductor 21. The insulating layer 20 may also be comprised of one or more dielectric layers. Note that $w_2$ is preferably greater than the width e of the MTJ 28.

Referring to FIGS. 10-14, the embodiment depicted in FIG. 7 is modified to encompass various configurations that incorporate a third conductor 35 having a width v that is preferably greater than the width of the storage layer 33a. Depending on circuit architecture, the top and bottom conductors may each be one of bit line, word line, or simply conduction electrodes and the third conductor can be a word line or bit line. For the purpose of this discussion, the top conductor 31 will hereafter be referred to as a bit line and the third conductor 35 will be designated a word line. According to the present invention, the third conductor is used for writing and may be placed in numerous locations relative to the storage layer and MTJ.

Figure 10:
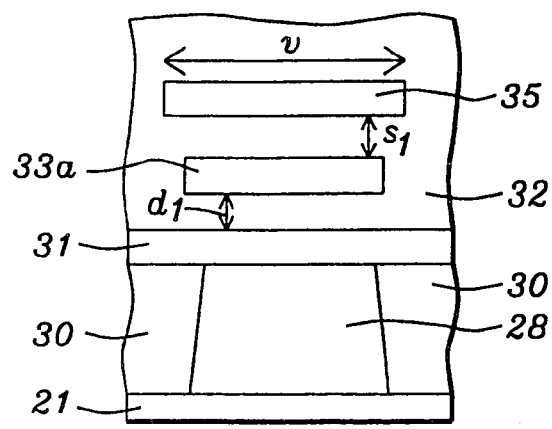
FIGS. 10-14 are cross-sections of a MRAM according to various embodiments of the present invention in which a storage layer and third conductor are positioned above a top conductor and a MTJ having a super-paramagnetic free layer.

Referring to FIG. 10, a first configuration is shown in which the storage layer 33a is formed a distance $d_1$ greater than 0 above the top conductor 31 in the insulating layer 32 and the third conductor 35 is placed a distance $s_1$ greater than 0 above the storage layer and within the insulating layer 32. It should be understood that the top conductor 31 and third conductor 35 are aligned substantially orthogonal to each other. During a write operation, write currents are passed in both the top conductor 31 and third conductor 35 to write the selected storage layer 33a which is advantageously placed between the top conductor and third conductor to achieve a high write efficiency. The bottom conductor 21 is used for connecting the MTJ 28 through a selection transistor (not shown) to ground.

Figure 11:
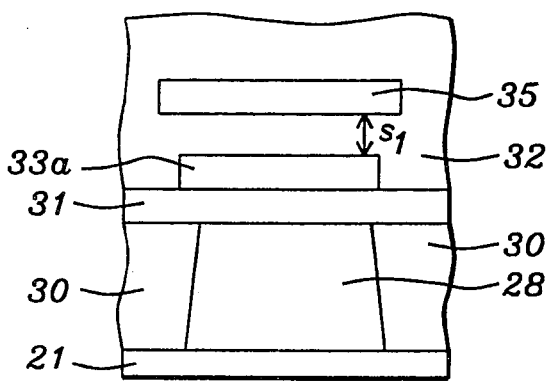

Referring to FIG. 11, a second configuration is shown wherein the storage layer 33a is electrically in contact with the top conductor 31 to reduce the spacing $d_1$ (FIG. 10) to zero between the storage layer and top conductor and thereby further increase the write efficiency. This arrangement has the additional advantage in that the distance between the storage layer 33a and the SP free layer (not shown) in the MTJ 28 is decreased to increase the read efficiency.

Figure 12:
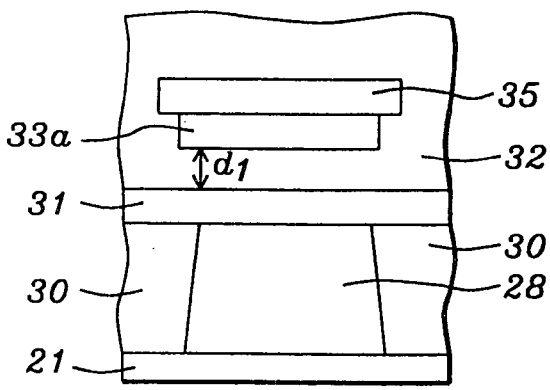

In FIG. 12, a third configuration is depicted in which the storage layer 33a is electrically in contact with the third conductor 35 to reduce the spacing $s_1$ (FIG. 10) to zero between the storage layer and third conductor and thereby further increase the write efficiency compared with the first configuration.

Figure 13:
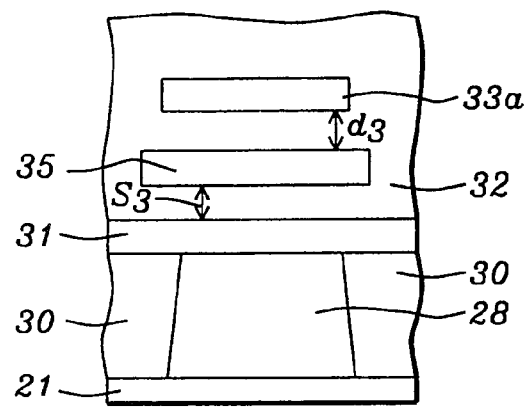

In FIG. 13, a fourth configuration is shown wherein the third conductor 35 is placed between top conductor 31 and storage layer 33a. The third conductor is located within dielectric layer 32 at a distance $s_3$ above the top conductor 31 and the storage layer 33a is formed a distance $d_3$ above the third conductor in dielectric layer 32.

Figure 14:
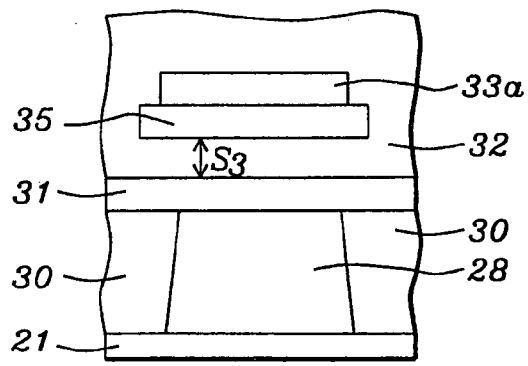

In FIG. 14, a fifth configuration is illustrated wherein the distance $d_3$ in FIG. 13 is reduced to zero. As a result, the storage layer 33a is in electrical contact with the third conductor 35 which improves both the write efficiency and read efficiency compared with the fourth configuration.

Referring to FIGS. 15-19, the embodiment depicted in FIG. 9 is modified to encompass various configurations that incorporate a third conductor 35 below the MTJ and bottom conductor. Again, the top conductor 31 may be considered as a bit line and the third conductor 35 will be designated a word line. The third conductor is used for writing and may be placed in numerous locations relative to the storage layer 33b and MTJ 28. Usually, the bottom conductor 21 is rather thin so that the configurations represented in FIGS. 15-19 have a reduced spacing between the storage layer 33b and the SP free layer (not shown) for enhanced read efficiency.

Figure 15:
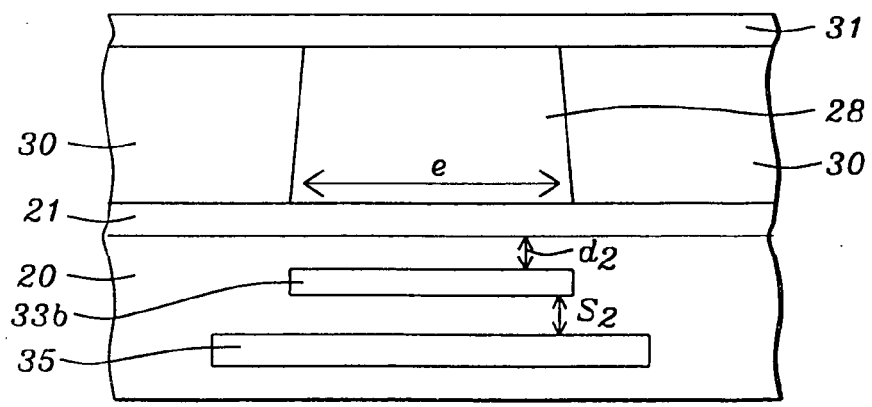
FIGS. 15-19 are cross-sections of a MRAM according to various embodiments of the present invention in which a storage layer and third conductor are positioned below a bottom conductor and a MTJ having a super-paramagnetic free layer.

Referring to FIG. 15, a sixth configuration is depicted in which the storage layer 33b is located within a dielectric layer 20 at a distance $d_2$ greater than zero beneath the bottom conductor 21 and the third conductor 35 is formed a distance $s_2$ greater than zero below the storage layer and within the dielectric layer 20.

Figure 16:
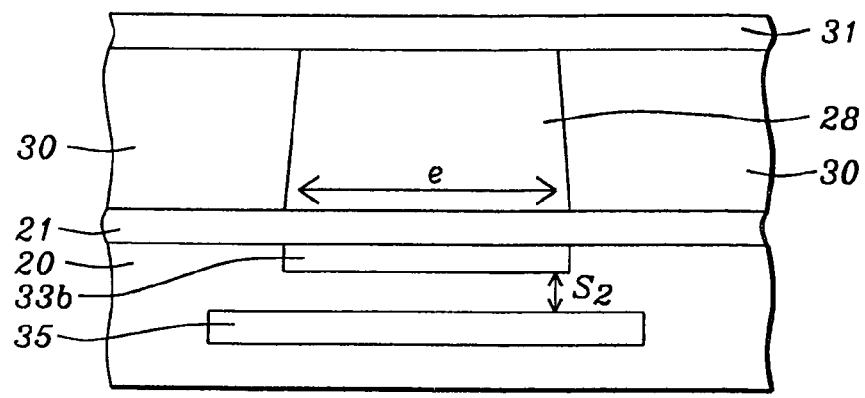

In FIG. 16, a seventh configuration is shown wherein the storage layer 33b is electrically in contact with the bottom conductor 21 to reduce the spacing $d_2$ to zero between the storage layer and bottom conductor and thereby reduces the distance between the storage layer 33b and the SP free layer (not shown) in the MTJ 28 to further increase the read efficiency. Moreover, the distance between the top conductor 31 and the storage layer 33b is reduced to improve the write efficiency.

Figure 17:
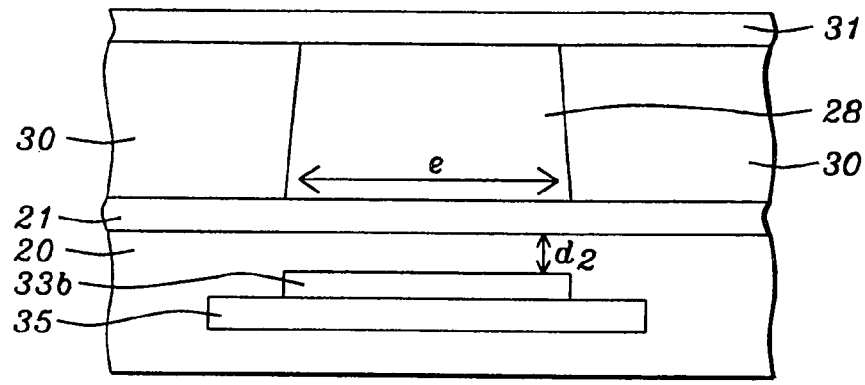

In FIG. 17, an eighth configuration is depicted in which the storage layer 33b is electrically in contact with the third conductor 35 to reduce the spacing $s_2$ to zero and thereby further increase the write efficiency compared with the sixth configuration.

Figure 18:
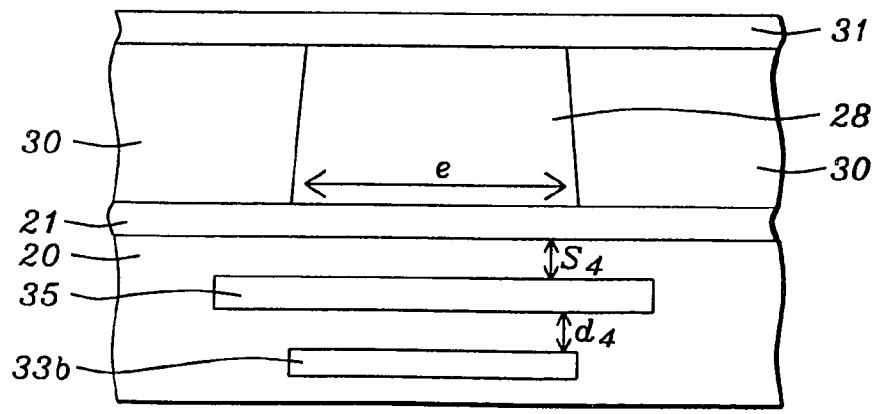

Referring to FIG. 18, a ninth configuration is shown in which the third conductor 35 is placed between the bottom conductor 21 and the storage layer 33b. The third conductor is located within the dielectric layer 20 at a distance $s_a$ greater than 0 below the bottom conductor 21 and the storage layer 33b is formed a distance $d_4$ greater than 0 below the third conductor in the dielectric layer 20.

Figure 19:
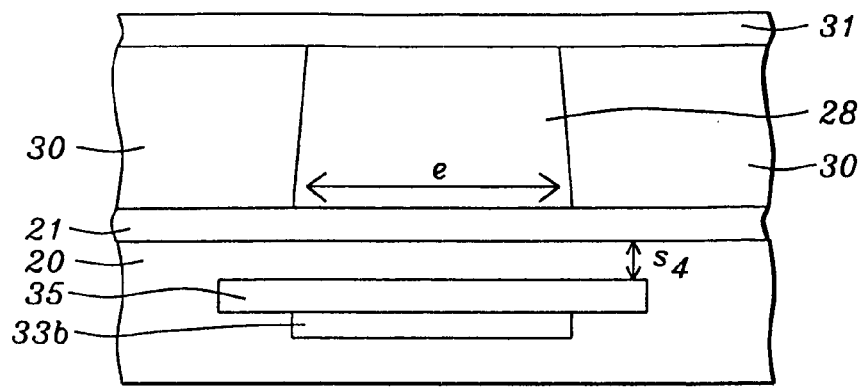

In FIG. 19, a tenth configuration is illustrated wherein the distance $d_4$ in FIG. 18 is reduced to zero. As a result, the storage layer 33b is in electrical contact with the third conductor 35 and is in closer proximity to the top conductor 31 which improves the write efficiency compared with the ninth configuration. Additionally, the storage layer 33b is closer to the SP free layer in the MTJ 28 which improves the read efficiency.

Figure 20:
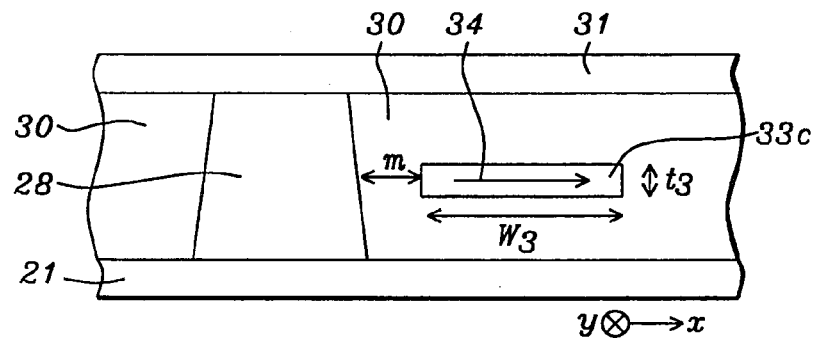
FIG. 20 is a cross-section of a MRAM according to one embodiment of the present invention in which a storage layer is separated from and positioned adjacent to a MTJ.

Referring to FIG. 20, another embodiment is depicted in which a storage layer 33c is formed adjacent to the MTJ 28. The storage layer has a thickness $t_3$ of between 10 and 100 Angstroms, a length $w_3$ of 0.05 to 0.5 microns oriented parallel to the x-axis, and is separated from a sidewall of the MTJ 21 by a distance m of about 50 to several thousand Angstroms. The length $w_3$ is preferably greater than the width e of the MTJ. In this example, the MTJ 28 is formed between a bottom conductor 21 and a top conductor 31 that functions as a bit line. As in previous embodiments, there may be a third conductor (word line) located above the top conductor 31 or below the bottom conductor 21. The storage layer 33c may be formed within the insulating layer 30 and has a stray field 34 oriented along the x-axis direction.

Referring to FIGS. 21-24, other embodiments are depicted wherein the storage layer 33d is formed within an MTJ 40 and therefore has the same shape from a top-down view (not shown) as the MTJ. The present invention encompasses as least four configurations wherein the storage layer 33d is formed on a non-magnetic conducting spacer layer 36 that serves as a seed layer to provide optimal growth of the storage layer crystalline structure. The MTJ 40 is comprised of the same layers as in MTJ 38 except for the storage layer 33d and spacer layer 36. The spacer layer 36 may be made of Ta, Cu, Ru, Au, Zr, Rh, Cr, W, or alloys or multilayers of the aforementioned elements with a thickness between 50 and 300 Angstroms. The storage layer 33d may be comprised of NiFe, CoFe, or alloys thereof, and has a thickness similar to $t_1$, $t_2$, or $t_3$ of storage layers 33a, 33b, or 33c, respectively. Moreover, the storage layer 33d has an easy axis and a stray field 34 oriented along the x-axis direction. In each configuration, an AFM layer 23 may be formed on a surface of the pinned layer 24 opposite the tunneling (insulating) layer 25.

Figure 21:
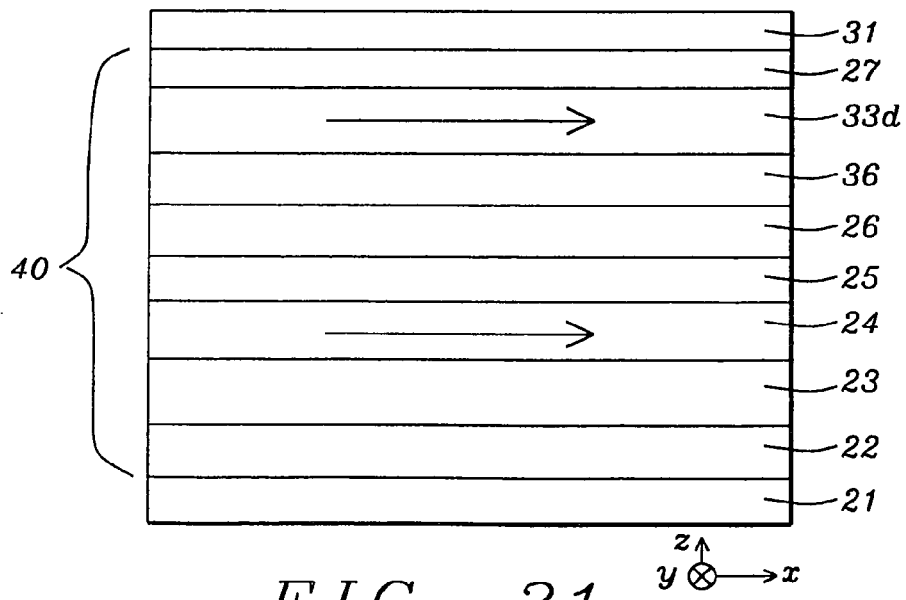
FIGS. 21-24 are cross-sections of a MTJ according to various embodiments of the present invention wherein the storage layer is formed on a non-magnetic conducting spacer layer within a MTJ element having a super-paramagnetic free layer

Referring to FIG. 21, a preferred configuration is shown that represents a bottom spin valve structure wherein the stack comprised of a lower spacer layer 36 and upper storage layer 33d is inserted between the SP free layer 26 and cap layer 27 described previously with respect to FIG. 4. In other words, the spacer layer 36 is formed on the SP free layer 26 and the cap layer 27 is disposed on the upper storage layer 33d. The top conductor 31 is formed on the cap layer 27.

Figure 22:
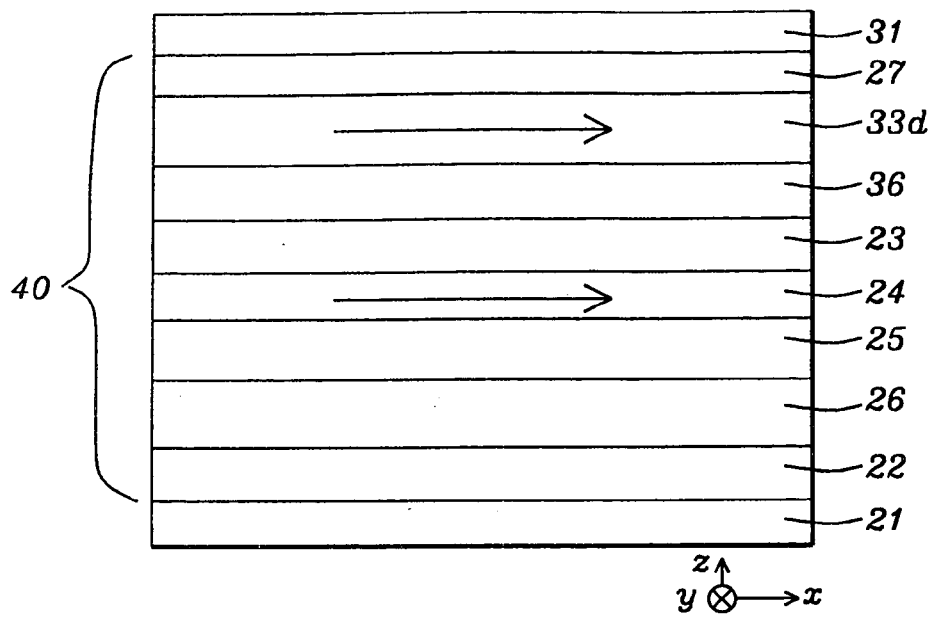

In FIG. 22, another configuration is depicted in which the sequential order of forming the AFM layer 23, pinned layer 24, tunneling layer 25, and SP free layer 26 in MTJ 40 (FIG.

21) is reversed so that the SP free layer 26 is formed on the seed layer 22 followed in succession by tunneling layer 25, pinned layer 24, AFM layer 23, spacer layer 36, storage layer 33d, and cap layer 27.

Figure 23:
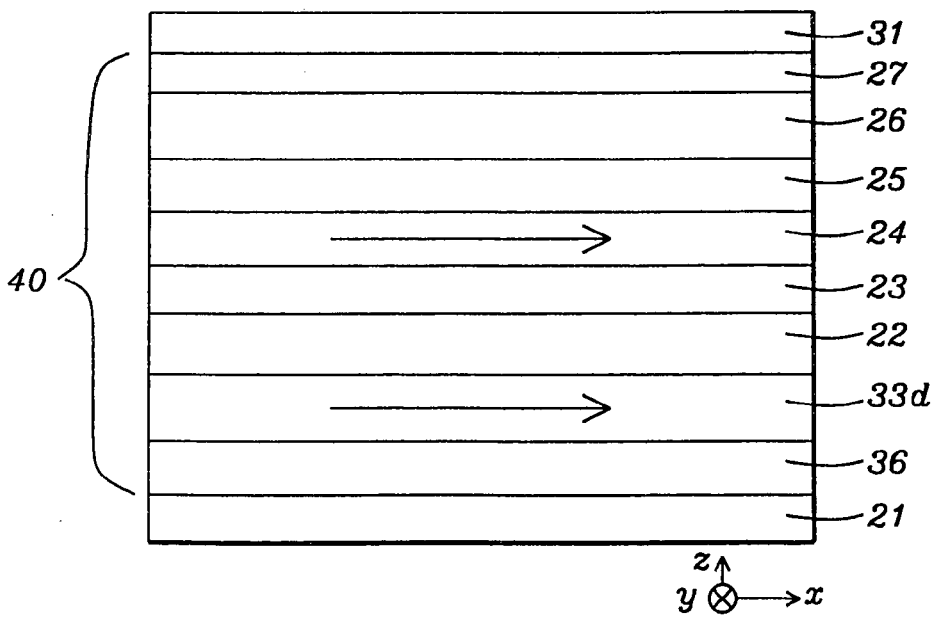

Yet another configuration is shown in FIG. 23 wherein the stack comprised of the lower spacer layer 36 and upper storage layer 33d is inserted between the bottom conductor 21 and the seed layer 22. For example, the seed layer 22, AFM layer 23, pinned layer 24, tunneling layer 25, SP free layer 26, and cap layer 27 may be formed sequentially on the storage layer 33d.

Figure 24:
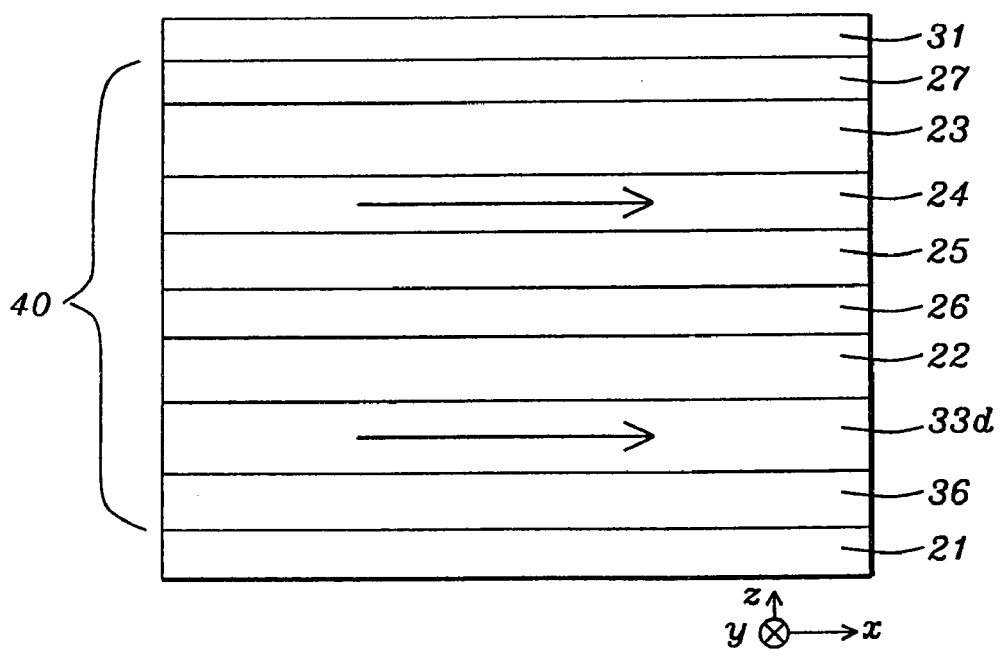

Referring to FIG. 24, another configuration is shown in which the sequential order of forming the AFM layer 23, pinned layer 24, tunneling layer 25, and SP free layer 26 in MTJ 40 (FIG. 23) is reversed so that the SP free layer 26 is formed on the seed layer 22 followed in succession by tunneling layer 25, pinned layer 24, AFM layer 23, and cap layer 27. The spacer layer 36 is disposed on the bottom conductor 21 and the seed layer 22 is formed on the storage layer 33d.

The present invention is also a method of making the previously described MTJ and storage layer. In one embodiment represented by FIGS. 21-24 that applies to MRAM applications, all the layers in MTJ 40 including the storage layer 33d and spacer layer 36 are fabricated during the same deposition and patterning process sequence. For example, in FIG. 21 the MTJ stack of layers 22-26 and the non-magnetic spacer layer 36 are laid down in sequential order on the bottom conductor 21 by employing a sputter deposition process known to those skilled in the art. As mentioned earlier, the tunneling layer 25 requires an oxidation step to transform an Al, Ti, Hf, or Mg layer to an oxide that serves as an insulating layer before the SP free layer 26 is deposited thereon. Optionally, the Al, Ti, Hf, or Mg layer may be converted to a nitride. After the spacer layer 36 is deposited, the storage layer 33b and then the cap layer 27 may be sputter deposited in the same sputter deposition system as the underlying MTJ layers. At this point, a photoresist layer (not shown) is patterned on the storage layer. Thereafter, an etch process such as an ion beam etch (IBE) is performed to remove portions of the storage layer and underlying MTJ layers that are not protected by the photoresist layer. The photoresist layer is removed by a conventional method and then an insulating layer (not shown) is deposited on the cap layer 27 and in the etched regions by a chemical vapor deposition (CVD) process or the like to a thickness above the cap layer. A planarization process may be carried out to form an essentially flat insulating layer that is about coplanar with the cap layer 27. Finally, an array of top conductors including the top conductor 31 may be formed by a conventional damascene process.

One advantage of the present invention is that the coupling between a ferromagnetic free layer and a pinned layer in a conventional MTJ is avoided because of the super-paramagnetic state of the free layer as described herein. As a result, there are no variations in switching threshold due to bias issues. The digital information in the storage layer is simply read out by the MTJ sensing element. Moreover, the storage layer can be optimized independently of the pinned layer, especially in configurations where the storage layer is formed above, below, or adjacent to the MTJ and is separate from the MTJ. Another benefit achieved with the present invention is that the incompatibility issue of free layer materials needing both a low Hc for good switching behavior and a high Fe content for larger MR ratios in an MTJ has been overcome because digital information is now stored in a separate storage layer rather than in the free layer for MRAM applications.

While this invention has been particularly shown and described with reference to, the preferred embodiment thereof, it will be understood by those skilled in the art that various changes in form and details may be made without departing from the spirit and scope of this invention.

We claim:

1. A method of forming a MTJ element in a MRAM structure, comprising:
   (a) depositing a seed layer on a planar conductive substrate;
   (b) forming a first stack on said seed layer, said first stack is comprised of a pinned layer, a super-paramagnetic (SP) free layer, a insulator layer between the pinned layer and SP free layer, and an AFM layer on a surface of the pinned layer opposite the insulating layer;
   (c) forming a second stack on the first stack, said second stack is comprised of a lower non-magnetic conducting spacer layer that contacts the first stack, and an upper storage layer that is planar and contacts the non-magnetic conducting spacer; and
   (d) forming a cap layer on said second stack.

2. The method of claim 1 wherein the SP free layer has a thickness between about 5 and 20 Angstroms and is comprised of a ferromagnetic material which is CoFeB, Co, Fe, Ni, CoFe, NiFe, or CoFeNi.

3. The method of claim 1 wherein said insulating layer is comprised of AlOx, TiOx, HfOx, MgO, or a lamination of one or more of the aforementioned oxides, or is made of AlNx, TiNx, HfNx, MgNx or a lamination of one or more of the aforementioned nitrides.

4. The method of claim 1 wherein said storage layer is ferromagnetic or ferrimagnetic and has a uniaxial anisotropy substantially along a first axis and in the same direction as that of the pinned layer.

5. The method of claim 4 wherein said ferromagnetic or ferrimagnetic storage layer is pinned by an AFM layer.

6. The method of claim 1 wherein the non-magnetic conducting spacer layer is comprised of Ta, Cu, Ru, Au, Ag, Zr, Rh, Cr, W, or alloys or multilayers thereof and has a thickness of about 5 to 300 Angstroms.

7. The method of claim 1 wherein the storage layer is a ferromagnetic layer with a synthetic anti-parallel (SyAP) configuration.

8. The method of claim 1 wherein the storage layer is a lamination of one or more ferromagnetic layers and/or one or more ferrimagnetic layers.

* * * * *